United States Patent
Akatsuka et al.

(10) Patent No.: US 12,218,488 B2
(45) Date of Patent: Feb. 4, 2025

(54) LIGHT EMITTING APPARATUS AND PROJECTOR

(71) Applicants: SEIKO EPSON CORPORATION, Tokyo (JP); SOPHIA SCHOOL CORPORATION, Tokyo (JP)

(72) Inventors: Yasuto Akatsuka, Chino (JP); Katsumi Kishino, Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 623 days.

(21) Appl. No.: 17/530,431

(22) Filed: Nov. 18, 2021

(65) Prior Publication Data

US 2022/0166194 A1 May 26, 2022

(30) Foreign Application Priority Data

Nov. 20, 2020 (JP) ................. 2020-193169

(51) Int. Cl.
*H01S 5/323* (2006.01)
*G03B 21/20* (2006.01)

(52) U.S. Cl.
CPC .......... *H01S 5/323* (2013.01); *G03B 21/2033* (2013.01)

(58) Field of Classification Search
CPC .... H01S 5/323; H01S 5/04253; H01S 5/1042; H01S 5/185; H01S 5/320225; H01S 5/11; H01S 5/04257; H01S 5/34333; H01S 5/42; G03B 21/2033
See application file for complete search history.

(56) References Cited

U.S. PATENT DOCUMENTS

| | | | |
|---|---|---|---|
| 7,436,870 B2 * | 10/2008 | Ono | H01S 5/2231 372/50.1 |
| 2006/0284187 A1 * | 12/2006 | Wierer, Jr. | C30B 29/60 257/E33.068 |
| 2011/0169025 A1 * | 7/2011 | Kishino | H01L 31/035227 257/E33.012 |

(Continued)

FOREIGN PATENT DOCUMENTS

| | | | | |
|---|---|---|---|---|
| DE | 102010012711 A1 * | 9/2011 | | B82Y 20/00 |
| JP | 2013239718 | 11/2013 | | |

(Continued)

*Primary Examiner* — Xinning(Tom) Niu
(74) *Attorney, Agent, or Firm* — JCIPRNET

(57) ABSTRACT

A light emitting apparatus includes a laminate including a columnar section. The columnar section includes an n-type semiconductor layer, a first p-type semiconductor layer, a light emitting layer provided between the n-type semiconductor layer and the first p-type semiconductor layer, and a second p-type semiconductor layer in contact with the first p-type semiconductor layer. The first p-type semiconductor layer is provided between the light emitting layer and the second p-type semiconductor layer. The first p-type semiconductor layer has a c-plane and a facet surface. The second p-type semiconductor layer has a c-plane region provided at the c-plane and a facet-surface region provided at the facet surface. The c-plane region has negatively polarized charges at an interface with the first p-type semiconductor layer. The facet-surface region has positively polarized charges at the interface.

8 Claims, 5 Drawing Sheets

(56) References Cited

U.S. PATENT DOCUMENTS

| | | | |
|---|---|---|---|
| 2016/0064608 A1* | 3/2016 | Chung | H01L 33/18 257/13 |
| 2020/0041889 A1 | 2/2020 | Ishizawa et al. | |
| 2020/0106244 A1 | 4/2020 | Noda et al. | |

FOREIGN PATENT DOCUMENTS

| | | |
|---|---|---|
| JP | 2020024982 | 2/2020 |
| JP | 2020057640 | 4/2020 |

* cited by examiner

LIGHT EMITTING APPARATUS AND PROJECTOR

The present application is based on, and claims priority from JP Application Serial Number 2020-193169, filed Nov. 20, 2020, the disclosure of which is hereby incorporated by reference herein in its entirety.

BACKGROUND

1. Technical Field

The present disclosure relates to a light emitting apparatus and a projector.

2. Related Art

Semiconductor lasers are expected as a high-luminance, next-generation light source. Among the semiconductor lasers, semiconductor lasers using nanocolumns are expected to achieve high power light emission at small radiation angles based on the photonic crystal effect provided by the nanocolumns. Such nanocolumns each have an n-type semiconductor layer, a p-type semiconductor layer, and a light emitting layer provided between the n-type semiconductor layer and the p-type semiconductor layer.

For example, JP-A-2020-57640 describes a plurality of columnar sections each having a light emitting layer with a c-plane region and a facet-surface region.

In a light emitting apparatus including the columnar sections described above, for example, when an InGaN layer is grown as each of the light emitting layers, the InGaN layer tends to be selectively grown at a central portion of the columnar section. It is therefore desired to selectively inject current into each of the columnar sections via the central portion thereof.

SUMMARY

An aspect of a light emitting apparatus according to the present disclosure includes a laminate including a columnar section. The columnar section includes an n-type semiconductor layer, a first p-type semiconductor layer, a light emitting layer provided between the n-type semiconductor layer and the first p-type semiconductor layer, and a second p-type semiconductor layer in contact with the first p-type semiconductor layer. The first p-type semiconductor layer is provided between the light emitting layer and the second p-type semiconductor layer. The first p-type semiconductor layer has a c-plane and a facet surface. The second p-type semiconductor layer has a c-plane region provided at the c-plane and a facet-surface region provided at the facet surface. The c-plane region has negatively polarized charges at an interface with the first p-type semiconductor layer. The facet-surface region has positively polarized charges at the interface.

An aspect of a light emitting apparatus according to the present disclosure includes a laminate including a columnar section. The columnar section includes an n-type semiconductor layer, a first p-type semiconductor layer, a light emitting layer provided between the n-type semiconductor layer and the first p-type semiconductor layer, and a second p-type semiconductor layer in contact with the first p-type semiconductor layer. The first p-type semiconductor layer is provided between the light emitting layer and the second p-type semiconductor layer. The first p-type semiconductor layer has a c-plane and a facet surface. The second p-type semiconductor layer has a c-plane region provided at the c-plane and a facet-surface region provided at the facet surface. The c-plane region has negatively polarized charges at an interface with the first p-type semiconductor layer. The facet-surface region has negatively polarized charges at the interface. Density of the negatively polarized charges at the interface of the facet-surface region is lower than density of the negatively polarized charges at the interface of the c-plane region.

An aspect of a projector according to the present disclosure includes any of the aspects of the light emitting apparatus.

DESCRIPTION OF EXEMPLARY EMBODIMENTS

A preferable embodiment of the present disclosure will be described below in detail with reference to the drawings. It is not intended that the embodiment described below unduly limit the contents of the present disclosure described in the appended claims. Further, all configurations described below are not necessarily essential configuration requirements of the present disclosure.

1. Light Emitting Apparatus

Figure 1:
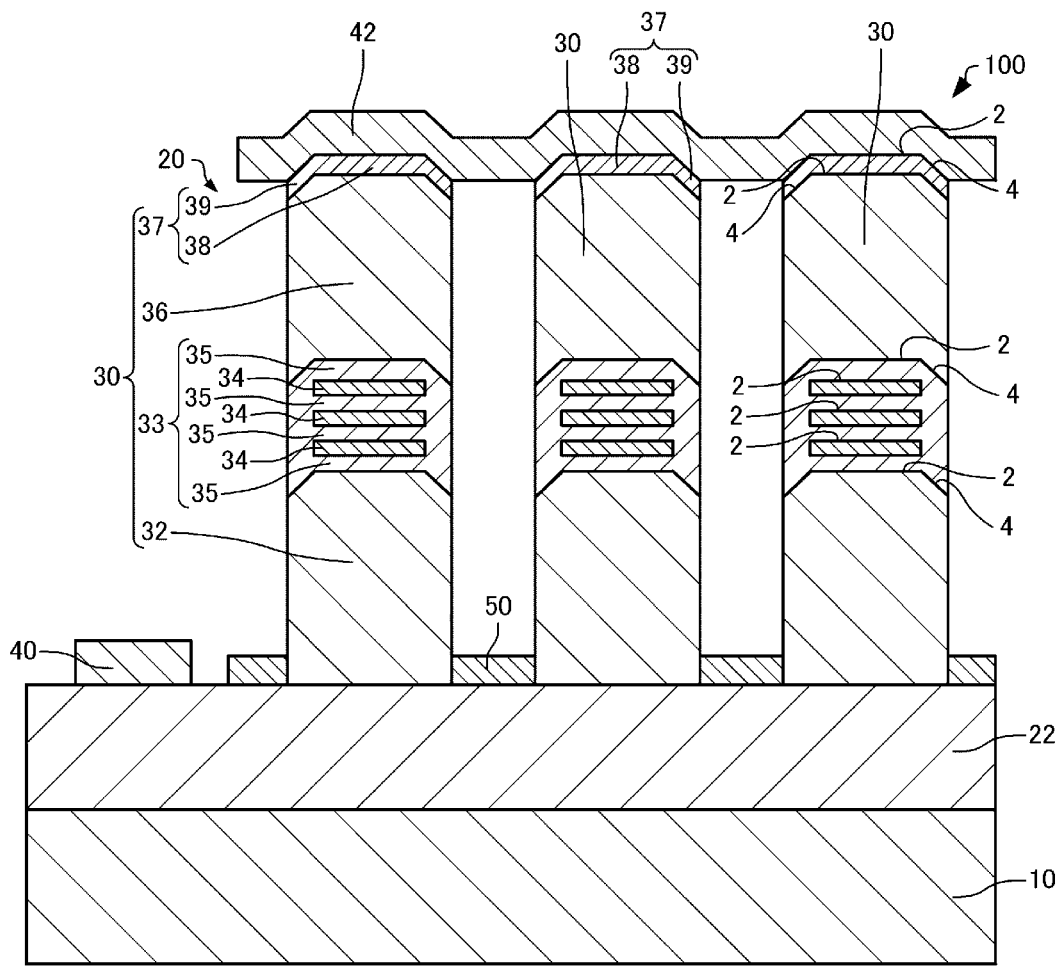
FIG. 1 is a cross-sectional view diagrammatically showing a light emitting apparatus according to an embodiment of the present disclosure.

A light emitting apparatus according to the present embodiment will first be described with reference to the drawings. FIG. 1 is a cross-sectional view diagrammatically showing a light emitting apparatus 100 according to the present embodiment.

The light emitting apparatus 100 includes, for example, a substrate 10, a laminate 20, a first electrode 40, and a second electrode 42, as shown in FIG. 1.

The substrate 10 is, for example, an Si substrate, a GaN substrate, or a sapphire substrate.

The laminate 20 is provided at the substrate 10. In the illustrated example, the laminate 20 is provided on the substrate 10. The laminate 20 includes, for example, a buffer layer 22 and columnar sections 30.

The present specification will be described on the assumption that in a lamination direction of the laminate (hereinafter also simply referred to as "lamination direction"), the direction from a light emitting layer 34 as a reference toward a first p-type semiconductor layer 36 is called "upper", and the direction from the light emitting layer 34 as the reference toward an n-type semiconductor layer 32 is called "lower". The direction perpendicular to the lamination direction is also called an "in-plane direction". The "lamination direction of the laminate 20" refers to the direction in which the n-type semiconductor layer 32 and the light emitting layer 34 of each of the columnar sections 30 are laminated on each other.

The buffer layer 22 is provided on the substrate 10. The buffer layer 22 is, for example, an n-type GaN layer into which Si has been doped. A mask layer 50 for forming the columnar sections 30 is provided on the buffer layer 22. The mask layer 50 is, for example, a silicon oxide layer, a titanium layer, a titanium oxide layer, or an aluminum oxide layer.

The columnar sections 30 are provided on the buffer layer 22. The columnar sections 30 each have a columnar shape protruding upward from the buffer layer 22. In other words, the columnar sections 30 protrude upward from the substrate 10 through the buffer layer 22. The columnar sections 30 are each also called, for example, a nano-column, a nano-wire, a nano-rod, and a nano-pillar. The columnar sections 30 each have, for example, a regular hexagonal planar shape or any other polygonal planar shape or a circular planar shape.

The columnar sections 30 each have a diameter, for example, greater than or equal to 50 nm but smaller than or equal to 500 nm. When the diameter of each of the columnar sections 30 is smaller than or equal to 500 nm, a high-quality-crystal light emitting layer 34 can be produced, and distortion intrinsically present in the light emitting layer 34 can be reduced. The light produced in the light emitting layer 34 can thus be efficiently amplified.

In a case where the columnar sections 30 each have a circular planar shape, the term "the diameter of each of the columnar sections" refers to the diameter of the circular shape, and when the columnar sections 30 each have a non-circular planar shape, the term refers to the diameter of the minimum circle containing the non-circular shape therein. For example, when the columnar sections 30 each have a polygonal planar shape, the diameter of each of the columnar sections 30 is the diameter of the smallest circle enclosing the polygonal shape, and when the columnar sections 30 each have an elliptical planar shape, the diameter of each of the columnar sections 30 is the diameter of the smallest circle enclosing the elliptical shape.

The columnar sections 30 are formed of a plurality of columnar sections 30. The distance between adjacent columnar sections 30 is, for example, greater than or equal to 1 nm but smaller than or equal to 500 nm. The plurality of columnar sections 30 are arranged in predetermined directions at predetermined intervals when viewed in the lamination direction. The plurality of columnar sections 30 are arranged, for example, in a triangular lattice. The plurality of columnar sections 30 are not necessarily arranged in a specific pattern and may be arranged in a square lattice. The plurality of columnar sections 30 can provide the photonic crystal effect.

The "interval between the columnar sections" is the distance between the centers of columnar sections 30 adjacent to each other in the predetermined directions. In the case where the columnar sections 30 each have a circular planar shape, the term "the centers of the columnar sections" refers to the center of the circle, and when the columnar sections 30 each have a non-circular planar shape, the term refers to the center of the minimum circle containing the non-circular shape therein. For example, when the columnar sections 30 each have a polygonal planar shape, the term refers to the center of the minimum circle containing the polygonal shape therein, and when the columnar sections 30 each have an elliptical planar shape, the terms refers to the center of the minimum circle containing the elliptical shape therein.

The columnar sections 30 each have, for example, the n-type semiconductor layer 32, a multiple quantum well (MQW) layer 33, the first p-type semiconductor layer 36, and a second p-type semiconductor layer 37.

The n-type semiconductor layers 32 are provided on the buffer layer 22. The n-type semiconductor layers 32 are provided between the substrate 10 and the light emitting layers 34. The n-type semiconductor layers 32 are, for example, each an n-type GaN layer to which Si has been doped.

The n-type semiconductor layers 32 each have a c-plane 2 and a facet surface 4. The c-plane 2 is, for example, parallel to the upper surface of the substrate 10. The facet surface 4 inclines with respect to the c-plane 2. The n-type semiconductor layers 32 are each in contact with the corresponding MQW layer 33 at the c-plane 2 and the facet surface 4.

The MQW layers 33 are provided on the n-type semiconductor layers 32. The MQW layers 33 are provided between the n-type semiconductor layers 32 and the first p-type semiconductor layers 36. The MQW layers 33 each have the c-plane 2 and the facet surface 4. The MQW layers 33 are each in contact with the corresponding first p-type semiconductor layer 36 at the c-plane 2 and the facet surface 4. The MQW layers 33 each have light emitting layers 34 and barrier layers 35. The MQW layers 33 each have an MQW structure formed of the light emitting layers 34 and the barrier layers 35.

The light emitting layers 34 are provided between the n-type semiconductor layers 32 and the first p-type semiconductor layers 36. The light emitting layers 34 are each provided between two barrier layers 35. The light emitting layers 34 are, for example, each an i-type InGaN layer. That is, the light emitting layers 34 are each an InGaN layer to which no impurities have been intentionally doped. The light emitting layers 34 each have the c-plane 2. In the illustrated example, the light emitting layers 34 each have no facet surface 4. The light emitting layers 34 produce light when current is injected thereinto. In the illustrated example, three light emitting layers 34 are provided in each of the MQW layers 33.

The barrier layers 35 are provided so as to sandwich the corresponding light emitting layer 34. The barrier layers 35 are, for example, each an i-type GaN layer. That is, the barrier layers 35 are each a GaN layer to which no impurities have been intentionally doped. The c-plane 2 and the facet face 4 of each of the MQW layers 33 are formed by the corresponding barrier layers 35. In the illustrated example, four light barrier layers 35 are provided in each of the MQW layers 33.

The number of light emitting layers 34 and the number of barrier layers 35 are each not limited to a specific number. For example, the number of light emitting layers 34 may be one, and in this case, the columnar sections 30 each have an single quantum well (SQW) layer in place of the MQW layer 33.

The first p-type semiconductor layers 36 are provided on the MQW layers 33. The first p-type semiconductor layers 36 are provided between the light emitting layers 34 and the second p-type semiconductor layers 37. The first p-type semiconductor layers 36 are, for example, each a p-type GaN layer into which Mg has been doped. The first p-type semiconductor layers 36 each have the c-plane 2 and the facet surface 4. The first p-type semiconductor layers 36 are each in contact with the corresponding second p-type semiconductor layer 37 at the c-plane 2 and the facet surface 4. In the illustrated example, the area of the c-plane 2 of each of the first p-type semiconductor layers 36 is equal to the area of the c-plane 2 of each of the light emitting layers 34. The n-type semiconductor layers 32 and the first p-type semiconductor layer 36 are each a cladding layer having the function of confining the light in the MQW layers 33.

The second p-type semiconductor layers 37 are provided on the first p-type semiconductor layers 36. The second p-type semiconductor layers 37 are in contact with the first p-type semiconductor layers 36. The second p-type semiconductor layers 37 are provided between the first p-type semiconductor layers 36 and the second electrode 42. The second p-type semiconductor layers 37 are thinner than the first p-type semiconductor layers 36. The thickness of each of the second p-type semiconductor layers 37 is, for example, greater than or equal to 0.1 nm but smaller than or equal to 20 nm, preferably greater than or equal to 0.5 nm but smaller than or equal to 10 nm. The second p-type semiconductor layers 37 each have the c-plane 2 and the facet surface 4. The second p-type semiconductor layers 37 are each in contact with the second electrode 42 at the c-plane 2 and the facet surface 4.

The second p-type semiconductor layers 37 are, for example, each a p-type InGaN layer into which Mg has been doped. When the second p-type semiconductor layers 37 and the light emitting layers 34 are each an InGaN layer, the InN molar fraction (at %) of In in the second p-type semiconductor layers 37 is lower than the InN molar fraction of In in the light emitting layers 34. The InN molar fraction of In in the second p-type semiconductor layers 37 is, for example, higher than or equal to 1 at % but lower than or equal to 20 at %, preferably higher than or equal to 5 at % but lower than or equal to 15 at %. When the InN molar fraction of In in the second p-type semiconductor layers 37 is higher than or equal to 1 at %, holes can be induced at the interfaces of the second p-type semiconductor layers 37 with the first p-type semiconductor layers 36. When the InN molar fraction of In in the second p-type semiconductor layers 37 is lower than or equal to 20 at %, conversion of the second p-type semiconductor layers 37 into second n-type semiconductor layers 37 due to produced defects can be suppressed. The InN molar fraction of In can be measured, for example, by atom probe analysis.

The second p-type semiconductor layers 37 each have a c-plane region 38 and a facet-surface region 39. The c-plane regions 38 are provided at the c-planes 2 of the first p-type semiconductor layers 36. The c-plane regions 38 are provided in central portions of the columnar sections 30 when viewed in the lamination direction. The c-plane regions 38 coincide with the light emitting layers 34 when viewed in the lamination direction. The facet-surface regions 39 are provided at the facet surfaces 4 of the first p-type semiconductor layers 36. The facet-surface regions 39 are provided on the side facing the sidewalls of the columnar sections 30 when viewed from in the lamination direction. The facet-surface regions 39 do not overlap with, for example, the light emitting layers 34 when viewed in the lamination direction.

Figure 2:
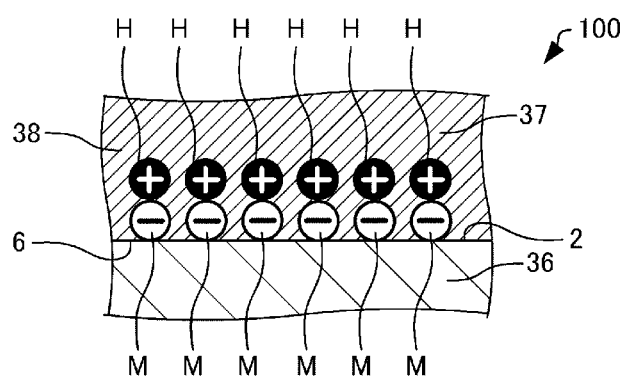
FIG. 2 is a cross-sectional view diagrammatically showing an interface of a second p-type semiconductor layer with a first p-type semiconductor layer of the light emitting apparatus according to the present embodiment and the vicinity of the interface.
Figure 3:
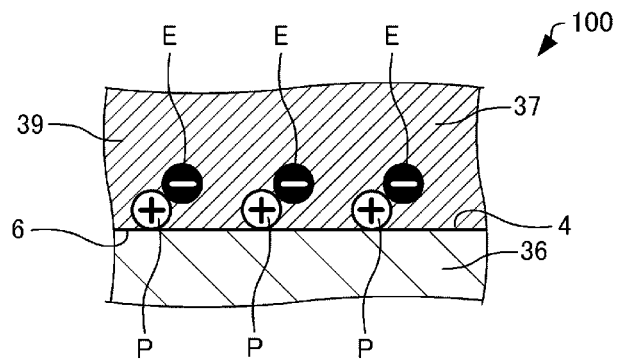
FIG. 3 is another cross-sectional view diagrammatically showing the interface of the second p-type semiconductor layer with the first p-type semiconductor layer of the light emitting apparatus according to the present embodiment and the vicinity of the interface.

FIGS. 2 and 3 are cross-sectional views diagrammatically showing the interface 6 of the second p-type semiconductor layer 37 with the first p-type semiconductor layer 36 and the vicinity of the interface 6. FIG. 2 shows the interface 6 of the c-plane region 38 and the vicinity of the interface 6. FIG. 3 shows the interface 6 of the facet-surface region 39 and the vicinity of the interface 6. The interface 6 is a heterojunction interface.

The c-plane regions 38 of the second p-type semiconductor layers 37 each have negatively polarized charges M at the interfaces 6, as shown in FIG. 2. When the second p-type semiconductor layers 37 are epitaxially grown on the c-planes 2 of the first p-type semiconductor layers 36, the c-plane regions 38 of the second p-type semiconductor layers 37 are distorted resulting from the difference in lattice constant between the first p-type semiconductor layers 36 and the second p-type semiconductor layers 37. The distorted c-plane regions 38 then produce the negatively polarized charges M at the interfaces 6. When the negatively polarized charges M are produced, holes H are induced in the c-plane regions 38. Since the c-plane regions 38 are each a p-type semiconductor layer, the induced holes H cause the c-plane regions 38 to have low resistance.

The facet-surface regions 39 of the second p-type semiconductor layers 37 have positively polarized charges P at the interfaces 6, as shown in FIG. 3. When the second p-type semiconductor layers 37 are epitaxially grown on the facet surfaces 4 of the first p-type semiconductor layers 36, the facet-surface regions 39 of the second p-type semiconductor layers 37 are distorted resulting from the difference in lattice constant between the first p-type semiconductor layers 36 and the second p-type semiconductor layers 37. The distorted facet-surface regions 39 then produce positively polarized charges P at the interfaces 6. When the positively polarized charges P are produced, electrons E are induced in the facet-surface regions 39. Since the facet-surface regions 39 are each a p-type semiconductor layer, the induced electrons E cause the c-plane region 38 to have high resistance.

The polarity of polarized charges at the interfaces 6 can be determined by performing structural analysis of a cross-section of the second p-type semiconductor layer 37 under a transmission electron microscope (TEM).

The density of the negatively polarized charges M at the interfaces 6 of the c-plane regions 38 with the first p-type semiconductor layers 36 is lower than the density of the positively polarized charges P at the interfaces 6 of the facet-surface regions 39 with the first p-type semiconductor layers 36. The density of the polarized charges at the interfaces 6 can be measured by performing the structural analysis of a cross-section of the second p-type semiconductor layer 37 under a TEM.

Figure 4:
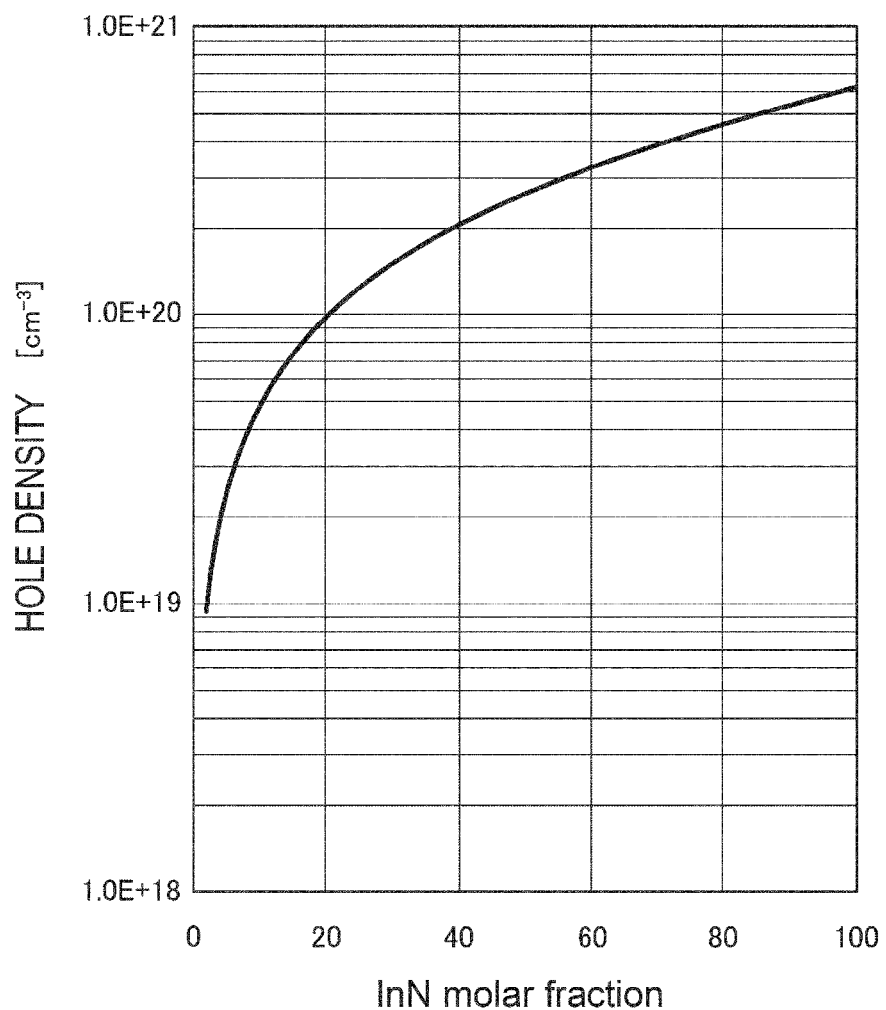
FIG. 4 is a graph showing a rough estimate of the density of holes induced in a c-plane region of the second p-type semiconductor layer of the light emitting apparatus according to the present embodiment.

FIG. 4 is a graph showing a rough estimate of the density of the holes induced in the c-plane regions 38 of the second p-type semiconductor layers 37. It is assumed in the rough estimate in FIG. 4 that the second p-type semiconductor layers 37 are each an InGaN layer, and that the holes are distributed throughout the InGaN layer having a thickness of 2 nm. The hole density in the c-plane regions 38 is estimated to be higher than $1\times10^{19}$ cm$^{-3}$ as shown in FIG. 4. The hole density in a typical p-type GaN layer is on the order of $1\times10^{17}$ cm$^{-3}$. The electron density in the facet-surface regions 39 is expected to be on the order of $1\times10^{18}$ cm$^{-3}$.

In the light emitting apparatus 100, the p-type semiconductor layers 36 and 37, the i-type MQW layers 33, into which no impurities have been doped, and the n-type semiconductor layers 32 form pin diodes. In the light emitting apparatus 100, when a forward bias voltage for the pin diodes is applied to the space between the first electrode 40 and the second electrode 42, current is injected into the light emitting layers 34, whereby electrons and holes recombine with each other in the light emitting layers 34. The recombination causes light emission. The light produced in the light emitting layers 34 propagates in the in-plane direction and forms a standing wave because of the photonic effect provided by the plurality of columnar sections 30, and the standing wave receives gain in the light emitting layers 34 to undergo laser oscillation. The light emitting apparatus 100 then outputs positive first order diffracted light and negative first order diffracted light as laser light in the lamination direction.

Although not shown, a reflection layer may be provided between the substrate 10 and the buffer layer 22 or below the substrate 10. The reflection layer is, for example, a distribution Bragg reflector (DBR) layer. The reflection layer can reflect the light produced in the light emitting layers 34, and the light emitting apparatus 100 can emit the light only via the side facing the second electrode 42.

The first electrode 40 is provided at the laminate 20, as shown in FIG. 1. In the illustrated example, the first electrode 40 is provided on the buffer layer 22. The buffer layer 22 may be in ohmic contact with the first electrode 40. The first electrode 40 is electrically coupled to the n-type semiconductor layers 32. In the illustrated example, the first electrode 40 is electrically coupled to the n-type semiconductor layers 32 via the buffer layer 22. The first electrode 40 is one of the electrodes for injecting the current into the light emitting layers 34. The first electrode 40 is, for example, a laminate of a Cr layer, an Ni layer, and an Au layer laminated in the presented order from the side facing the buffer layer 22.

The second electrode 42 is provided at the laminate 20. In the illustrated example, the second electrode 42 is provided on the second p-type semiconductor layers 37. The second electrode 42 is in contact with the second p-type semiconductor layers 37. The second electrode 42 is electrically coupled to the first p-type semiconductor layers 36. In the illustrated example, the second electrode 42 is electrically coupled to the first p-type semiconductor layers 36 via the second p-type semiconductor layers 37. The second p-type semiconductor layers 37 may be in ohmic contact with the second electrode 42. The second p-type semiconductor layers 37 is, for example, each a contact layer. The second electrode 42 is the other one of the electrodes for injecting the current into the light emitting layers 34. The second electrode 42 is made, for example, of an indium tin oxide (ITO).

The light emitting apparatus 100 can provide, for example, the following effects and advantages.

In the light emitting apparatus 100, the first p-type semiconductor layers 36 each have the c-plane 2 and the facet surface 4, and the second p-type semiconductor layers 37 each have the c-plane region 38 provided at the c-plane 2 of the corresponding first p-type semiconductor layer 36 and the facet-surface region 39 provided at the facet surface 4 of the first p-type semiconductor layer 36. The c-plane region 38 has the negatively polarized charges M at the interface 6 with the first p-type semiconductor layer 36, and the facet-surface region 39 has the positively polarized charges P at the interface 6 with the first p-type semiconductor layer 36. Therefore, in the light emitting apparatus 100, the holes H are induced by the negatively polarized charges M at the interfaces 6 of the c-plane regions 38, lowering the resistance of the c-plane regions 38. On the other hand, at the interfaces 6 of the facet-surface regions 39, the electrons E are induced by the positively polarized charges P, raising the resistance of the facet-surface regions 39. Since a p-type semiconductor layer has higher resistance than an n-type semiconductor layer, less current spreads in the in-plane direction in a p-type semiconductor layer than in an n-type semiconductor layer. Current can therefore be selectively injected into the columnar sections 30 via central portions thereof, where the light emitting layers 34 are located, and the current injected into the columnar sections 30 via sidewall portions thereof, where no light emitting layer 34 is located, can be reduced. As a result, the current can be efficiently injected into the light emitting layers 34.

In the light emitting apparatus 100, the density of the negatively polarized charges M at the interfaces 6 of the c-plane regions 38 with the first p-type semiconductor layers 36 is higher than the density of the positively polarized charges P at the interfaces 6 of the facet-surface regions 39 with the first p-type semiconductor layers 36. Therefore, in the light emitting apparatus 100, for example, a larger number of holes H can be induced in the c-plane regions 38 than when the density of the negatively polarized charges at the interfaces 6 of the c-plane regions 38 with the first p-type semiconductor layers 36 is lower than the density of the positively polarized charges at the interfaces 6 of the facet-surface regions 39 with the first p-type semiconductor layers 36.

In the light emitting apparatus 100, the first p-type semiconductor layers 36 are each a GaN layer, and the second p-type semiconductor layers 37 are each an InGaN layer. Therefore, in the light emitting apparatus 100, distortion resulting from the difference in lattice constant between the GaN layer and the InGaN layer allows the negatively polarized charges M to be induced at the interfaces 6 of the c-plane regions 38 and the positively polarized charges P to be induced at the interfaces 6 of the facet-surface regions 39.

In the light emitting apparatus 100, the light emitting layers 34 are each an InGaN layer, and the InN molar fraction of In in the second p-type semiconductor layers 37 is lower than the InN molar fraction of In in the light emitting layers 34. Therefore, in the light emitting apparatus 100, the light can be confined in the light emitting layers 34 as compared with a case where the InN molar fraction of In in the second p-type semiconductor layers is higher than the InN molar fraction of In in the light emitting layers.

In the light emitting apparatus 100, the light emitting layers 34 each have the c-plane 2. Therefore, in the light emitting apparatus 100, non-light-emission recombination due to defects can be suppressed as compared with a case where the light emitting layers each have no c-plane but have a facet surface.

The light emitting apparatus 100 includes the second electrode 42 provided at the laminate 20 and being in contact with the second p-type semiconductor layers 37. Therefore, in the light emitting apparatus 100, the current between the second electrode 42 and the light emitting layers 34 can be narrowed so that the current flows selectively to the central portion of each of the columnar sections 30.

The second p-type semiconductor layers 37 may each be a layer into which no impurities have been doped. Even when no impurities have been doped into the second p-type semiconductor layers 37, the negatively polarized charges M induce the holes H in the c-plane regions 38 of the second p-type semiconductor layers 37 as described above, so that the second p-type semiconductor layers 37, which are each a p-type semiconductor layer, are formed.

The light emitting apparatus 100 is not limited to a laser and may instead be an LED (light emitting diode).

2. Method for Manufacturing Light Emitting Apparatus

Figure 5:
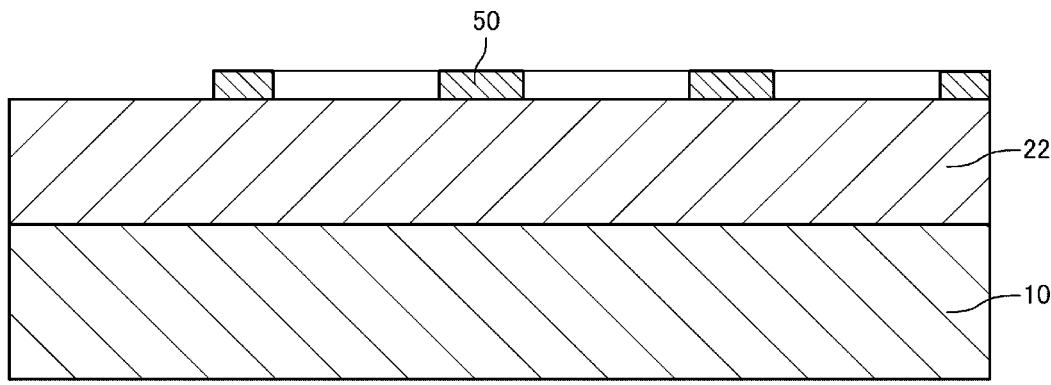
FIG. 5 is a cross-sectional view diagrammatically showing one of the steps of manufacturing the light emitting apparatus according to the present embodiment.

A method for manufacturing the light emitting apparatus 100 according to the present embodiment will next be described with reference to the drawings. FIG. 5 is a cross-sectional view diagrammatically showing one of the steps of manufacturing the light emitting apparatus 100 according to the present embodiment.

The buffer layer 22 is epitaxially grown on the substrate 10, as shown in FIG. 5. Examples of the epitaxial growth method may include a metal organic chemical vapor deposition (MOCVD) method and a molecular beam epitaxy (MBE) method.

The mask layer 50 is then formed on the buffer layer 22. The mask layer 50 is formed, for example, by film deposition using an electron beam evaporation method or a plasma chemical vapor deposition (CVD) method and patterning. The patterning is performed, for example, by photolithography and etching.

The mask layer 50 is used as a mask to epitaxially grow the n-type semiconductor layers 32, the MQW layers 33, the first p-type semiconductor layers 36, and the second p-type semiconductor layers 37 in the presented order on the buffer layer 22, as shown in FIG. 1. Examples of the epitaxial growth method may include the MOCVD method and the MBE method.

The plurality of columnar sections 30 can be formed by carrying out the steps described above.

Thereafter, the first electrode 40 is formed on the buffer layer 22, and the second electrode 42 is formed on the second p-type semiconductor layers 37. The first electrode 40 and the second electrode 42 are formed, for example, by a vacuum evaporation method. The first electrode 40 and the second electrode 42 are not necessarily formed in a specific order.

The light emitting apparatus 100 can be manufactured by carrying out the steps described above.

3. Variations of Light Emitting Apparatus 3.1 First Variation

Figure 6:
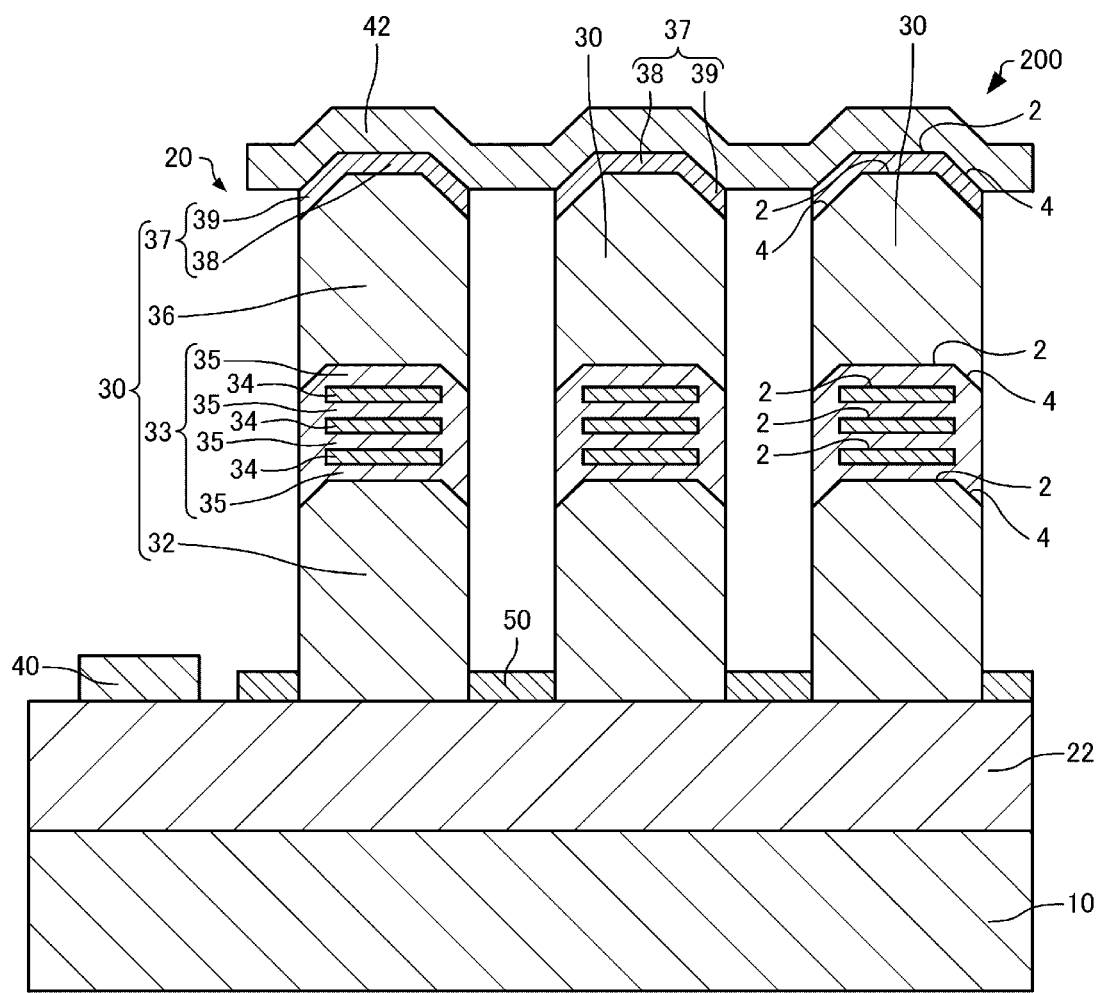
FIG. 6 is a cross-sectional view diagrammatically showing the light emitting apparatus according to a first variation of the present embodiment.

A light emitting apparatus according to a first variation of the present embodiment will next be described with reference to the drawings. FIG. 6 is a cross-sectional view diagrammatically showing a light emitting apparatus 200 according to the first variation of the present embodiment.

In the following description of the light emitting apparatus 200 according to the first variation of the present embodiment, a member having the same function as that of a constituent member of the light emitting apparatus 100 according to the present embodiment described above have the same reference character and will not be described in detail. The same holds true for the light emitting apparatuses according to second and third variations of the present embodiment shown below.

In the light emitting apparatus 100 described above, the area of the c-plane 2 of each of the first p-type semiconductor layers 36 is equal to the area of the c-plane 2 of each of the light emitting layers 34, as shown in FIG. 1.

In contrast, in the light emitting apparatus 200, the area of the c-plane 2 of each of the first p-type semiconductor layers 36 is smaller than the area of the c-plane 2 of each of the light emitting layers 34, as shown in FIG. 6. Therefore, in the light emitting apparatus 200, the current injected into the columnar sections 30 via the sidewall portions thereof, where no light emitting layer 34 is located, can be reduced as compared with the case where the area of the c-plane 2 of each of the first p-type semiconductor layers 36 is equal to the area of the c-plane 2 of each of the light emitting layers 34.

For example, when the first p-type semiconductor layers 36 are epitaxially grown, adjusting the deposition temperature in the epitaxial growth, the composition of the first p-type semiconductor layers 36, and other parameters allows the area of the c-plane 2 of each of the first p-type semiconductor layers 36 to be smaller than the area of the c-plane 2 of each of the light emitting layers 34.

3.2 Second Variation

Figure 7:
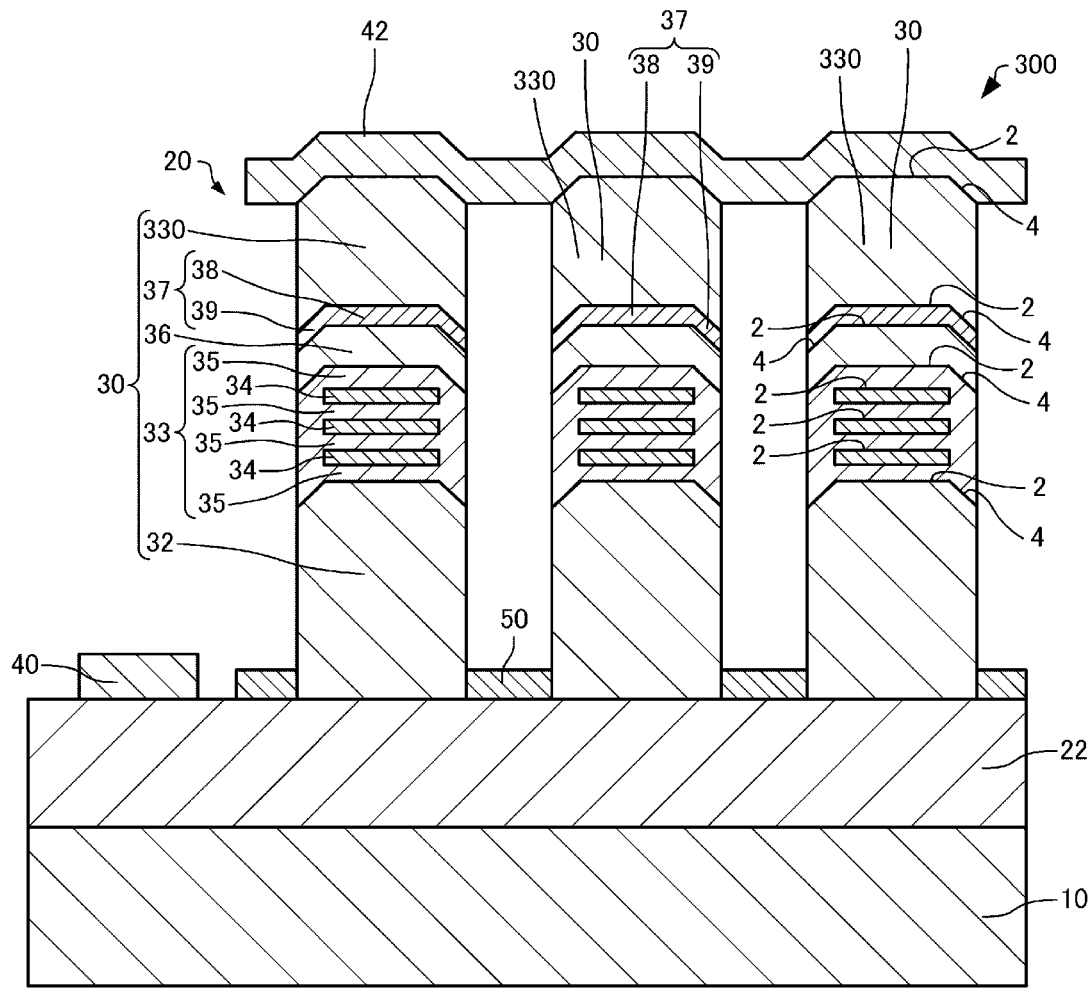
FIG. 7 is a cross-sectional view diagrammatically showing the light emitting apparatus according to a second variation of the present embodiment.

A light emitting apparatus according to a second variation of the present embodiment will next be described with reference to the drawings. FIG. 7 is a cross-sectional view diagrammatically showing a light emitting apparatus 300 according to the second variation of the present embodiment.

In the light emitting apparatus 100 described above, the second electrode 42 is in contact with the second p-type semiconductor layers 37, as shown in FIG. 1.

In contrast, in the light emitting apparatus 300, the second electrode 42 is not in contact with the second p-type semiconductor layers 37 but is in contact with third p-type semiconductor layers 330, as shown in FIG. 7.

In the light emitting apparatus 300, the columnar sections 30 include the third p-type semiconductor layers 330. The third p-type semiconductor layers 330 are provided on the second p-type semiconductor layers 37. The third p-type semiconductor layers 330 are in contact with the second p-type semiconductor layers 37. The third p-type semiconductor layers 330 are provided between the second p-type semiconductor layers 37 and the second electrode 42.

The third semiconductor layers 330 each have the c-plane 2 and the facet surface 4. The third semiconductor layers 330 are each in contact with the second electrode 42 at the c-plane 2 and the facet surface 4. The third p-type semiconductor layers 330 are, for example, each a p-type GaN layer into which Mg has been doped. The second electrode 42 is electrically coupled to the first p-type semiconductor layers 36 via the third p-type semiconductor layers 330 and the second p-type semiconductor layers 37. The third p-type semiconductor layers 330 may be in ohmic contact with the second electrode 42. The third p-type semiconductor layers 330 are, for example, each a contact layer. The third p-type semiconductor layers 330 are formed by epitaxial growth, for example, the MOCVD method and the MBE method.

In the light emitting apparatus 300, current can be selectively injected into the columnar sections 30 via the central portions thereof, where the light emitting layers 34 are located, as in the light emitting apparatus 100 described above.

Furthermore, in the light emitting apparatus 300, the columnar sections 30 include the third p-type semiconductor layers 330, which are provided between the second p-type semiconductor layers 37 and the second electrode 42 and are in contact with the second electrode 42. Therefore, in the light emitting apparatus 300, the p-type semiconductor layers in contact with the second electrode 42 can be set with increased flexibility.

3.3 Third Variation

Figure 8:
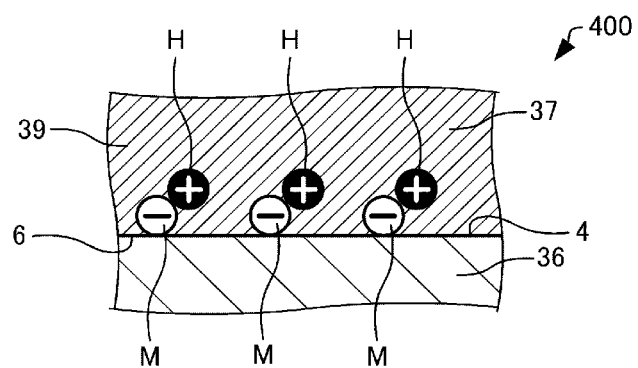
FIG. 8 is a cross-sectional view diagrammatically showing the interface of the second p-type semiconductor layer with the first p-type semiconductor layer of the light emitting apparatus according to a third variation of the present embodiment and the vicinity of the interface.

The light emitting apparatus according to a third variation of the present embodiment will next be described with reference to the drawings. FIG. 8 is a cross-sectional view diagrammatically showing the interface 6 of a second p-type semiconductor layer 37 with a first p-type semiconductor layer 36 of a light emitting apparatus 400 according to the third variation of the present embodiment and the vicinity of the interface 6. FIG. 8 shows the interface 6 of a facet-surface region 39 and the vicinity of the interface 6.

In the light emitting apparatus 100 described above, the positively polarized charges P are induced at the interfaces 6 of the facet-surface regions 39 of the second p-type semiconductor layers 37, as shown in FIG. 3.

In contrast, in the light emitting apparatus 400, the negatively polarized charges M are induced at the interfaces 6 of the facet-surface regions 39 of the second p-type semiconductor layers 37, as shown in FIG. 8. The density of the negatively polarized charges M at the interfaces 6 of the facet-surface regions 39 is lower than the density of the negatively polarized charges M at the interfaces 6 of the c-plane regions 38. Therefore, even when the holes H are induced in the facet-surface regions 39, the density of the holes H in the facet-surface regions 39 is lower than the density of the holes H in the c-plane regions 38. In the light emitting apparatus 400, the current can be selectively injected into the columnar sections 30 via the central portions thereof, where the light emitting layers 34 are located, as in the light emitting apparatus 100 described above.

In the method for manufacturing the light emitting apparatus 400, the first p-type semiconductor layers 36 are grown under growth conditions that the inclination angle of the facet surfaces 4 of the first p-type semiconductor layers 36 with respect to the c-planes 2 of the first p-type semiconductor layers 36 is smaller than, for example, the inclination angle in the method for manufacturing the light emitting apparatus 100. The polarity of the polarized charges at the interfaces 6 of the facet-surface regions 39 can thus be controlled by changing the inclination angle of the facet surfaces 4 with respect to the c-planes 2 of the first p-type semiconductor layers 36. Except for the growth conditions described above under which the first p-type semiconductor layers 36 are grown, the method for manufacturing the light emitting apparatus 400 is basically the same as the method for manufacturing the light emitting apparatus 100.

4. Projector

Figure 9:
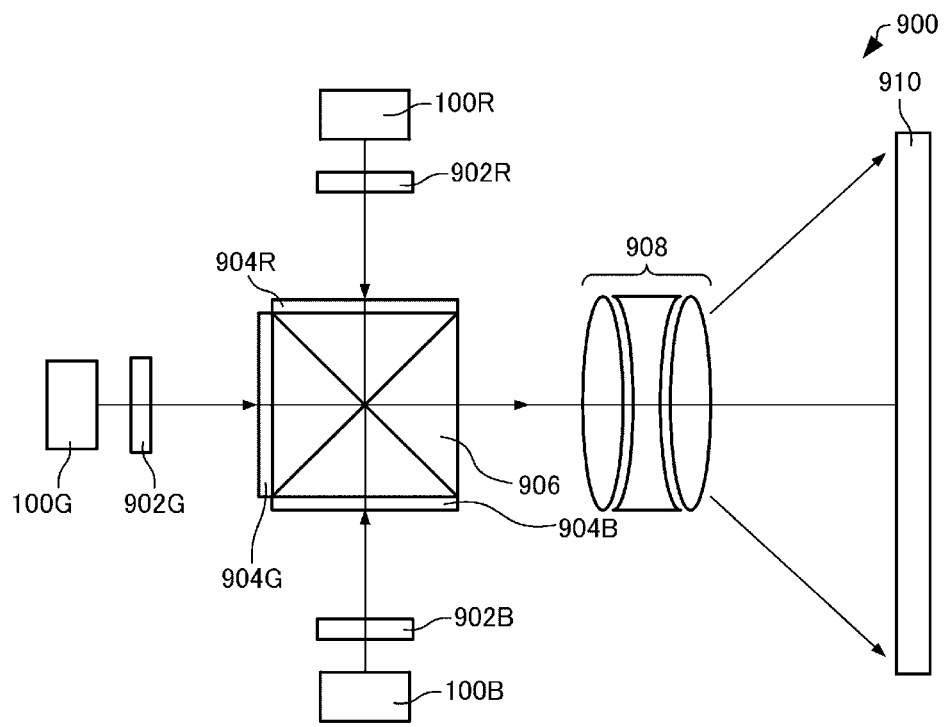
FIG. 9 diagrammatically shows a projector according to the present embodiment.

A projector according to the present embodiment will next be described with reference to the drawings. FIG. 9 diagrammatically shows a projector 900 according to the present embodiment.

The projector 900 includes the light emitting apparatus 100, for example, as a light source.

The projector 900 includes an enclosure that is not shown and a red light source 100R, a green light source 100G, and a blue light source 100B, which are provided in the enclosure and emit red light, green light, and blue light, respectively. In FIG. 9, the red light source 100R, the green light source 100G, and the blue light source 100B are simplified for convenience.

The projector 900 further includes a first optical element 902R, a second optical element 902G, a third optical element 902B, a first light modulator 904R, a second light modulator 904G, a third light modulator 904B, and a projection apparatus 908, which are provided in the enclosure. The first light modulator 904R, the second light modulator 904G, and the third light modulator 904B are each, for example, a transmissive liquid crystal light valve. The projection apparatus 908 is, for example, a projection lens.

The light outputted from the red light source 100R enters the first optical element 902R. The first optical element 902R collects the light outputted from the red light source 100R. The first optical element 902R may have another function in addition to the light collection function. The same holds true for the second optical element 902G and the third optical element 902B, which will be described later.

The light collected by the first optical element 902R is incident on the first light modulator 904R. The first light modulator 904R modulates the light incident thereon in accordance with image information. The projection apparatus 908 then enlarges an image formed by the first light modulator 904R and projects the enlarged image on a screen 910.

The light outputted from the green light source 100G enters the second optical element 902G. The second optical element 902G collects the light outputted from the green light source 100G.

The light collected by the second optical element 902G is incident on the second light modulator 904G. The second light modulator 904G modulates the light incident thereon in accordance with image information. The projection apparatus 908 then enlarges an image formed by the second light modulator 904G and projects the enlarged image on the screen 910.

The light outputted from the blue light source 100B enters the third optical element 902B. The third optical element 902B collects the light outputted from the blue light source 100B.

The light collected by the third optical element 902B is incident on the third light modulator 904B. The third light modulator 904B modulates the light incident thereon in accordance with image information. The projection apparatus 908 then enlarges an image formed by the third light modulator 904B and projects the enlarged image on the screen 910.

The projector 900 can further include a cross dichroic prism 906, which combines the light outputted from the first light modulator 904R, the light outputted from the second light modulator 904G, and the light outputted from the third light modulator 904B with one another and guides the combined light to the projection apparatus 908.

The red light modulated by the first light modulator 904R, the green light modulated by the second light modulator 904G, and the blue light modulated by the third light modulator 904B enter the cross dichroic prism 906. The cross dichroic prism 906 is formed by bonding four right-angled prisms to each other, and a dielectric multilayer film that reflects the red light and a dielectric multilayer film that reflects the blue light are disposed at the inner surfaces of the combined prisms. The dielectric multilayer films combine the red light, the green light, and the blue light with one another to form light representing a color image. The combined light is then projected by the projection apparatus 908 on the screen 910, whereby an enlarged image is displayed.

The red light source 100R, the green light source 100G, and the blue light source 100B may instead directly form images without using the first light modulator 904R, the second light modulator 904G, or the third light modulator 904B but controlling the respective light emitting apparatuses 100 as the pixels of the images in accordance with the image information. The projection apparatus 908 may then enlarge and project the images formed by the red light source 100R, the green light source 100G, and the blue light source 100B on the screen 910.

In the example described above, transmissive liquid crystal valves are used as the light modulators, and light valves not based on liquid crystal materials or reflective light valves may be used. Examples of such light valves may include reflective liquid crystal light valves and digital micromirror devices. The configuration of the projection apparatus is changed as appropriate in accordance with the type of the light valves used in the projector.

The present disclosure is also applicable to a light source apparatus of a scanning-type image display apparatus including a light source and a scanner that is an image formation apparatus that displays an image having a desired size on a display surface by scanning the screen with the light from the light source.

The light emitting apparatus according to the embodiment described above can be used in other applications in addition to a projector. Examples of the application other than a projector may include an indoor or outdoor illuminator, a backlight of a display, a laser printer, a scanner, an in-vehicle light, a sensing instrument using light, and a light source of a communication instrument. The light emitting apparatus according to the embodiment described above can also be used as minute light emitters of an LED display that has the light emitters arranged in an array to display images.

The embodiment and the variations described above are presented by way of example, and the present disclosure is not limited thereto. For example, the embodiment and the variations can be combined with each other as appropriate. The present disclosure encompasses substantially the same configuration as the configuration described in the embodiment, for example, a configuration having the same function, using the same method, and providing the same result or a configuration having the same purpose and providing the same effect. Furthermore, the present disclosure encompasses a configuration in which an inessential portion of the configuration described in the embodiment is replaced. Moreover, the present disclosure encompasses a configuration that provides the same effects and advantages as those provided by the configuration described in the embodiment or a configuration that can achieve the same purpose as that achieved by the configuration described in the embodiment. Furthermore, the present disclosure encompasses a configuration in which a known technology is added to the configuration described in the embodiment.

The following contents are derived from the embodiment and the variations described above.

An aspect of a light emitting apparatus includes a laminate including a columnar section. The columnar section includes an n-type semiconductor layer, a first p-type semiconductor layer, a light emitting layer provided between the n-type semiconductor layer and the first p-type semiconductor layer, and a second p-type semiconductor layer in contact with the first p-type semiconductor layer. The first p-type semiconductor layer is provided between the light emitting layer and the second p-type semiconductor layer. The first p-type semiconductor layer has a c-plane and a facet surface. The second p-type semiconductor layer has a c-plane region provided at the c-plane and a facet-surface region provided at the facet surface. The c-plane region has negatively polarized charges at an interface with the first p-type semiconductor layer. The facet-surface region has positively polarized charges at the interface.

According to the light emitting apparatus, current can be selectively injected into the columnar section via a central portion thereof where the light emitting layer is located.

In the aspect of the light emitting apparatus, the density of the negatively polarized charges at the interface of the c-plane region may be higher than the density of the positively polarized charges at the interface of the facet-surface region.

According to the light emitting apparatus, for example, a larger number of holes can be induced in the c-plane region than when the density of the negatively polarized charges at the interface of the c-plane region with the first p-type semiconductor layer is lower than the density of the positively polarized charges at the interface of the facet-surface region with the first p-type semiconductor layer.

Another aspect of the light emitting apparatus includes a laminate including a columnar section. The columnar section includes an n-type semiconductor layer, a first p-type semiconductor layer, a light emitting layer provided between the n-type semiconductor layer and the first p-type semiconductor layer, and a second p-type semiconductor layer in contact with the first p-type semiconductor layer. The first p-type semiconductor layer is provided between the light emitting layer and the second p-type semiconductor layer. The first p-type semiconductor layer has a c-plane and a facet surface. The second p-type semiconductor layer has a c-plane region provided at the c-plane and a facet-surface region provided at the facet surface. The c-plane region has negatively polarized charges at an interface with the first p-type semiconductor layer. The facet-surface region has negatively polarized charges at the interface. The density of the negatively polarized charges at the interface of the facet-surface region is lower than the density of the negatively polarized charges at the interface of the c-plane region.

According to the light emitting apparatus, current can be selectively injected into the columnar section via a central portion thereof where the light emitting layer is located.

In the aspect of the light emitting apparatus, the first p-type semiconductor layer may be a GaN layer, and the second p-type semiconductor layer may be an InGaN layer.

According to the light emitting apparatus, distortion resulting from the difference in lattice constant between the GaN layer and the InGaN layer allows the negatively polarized charges to be induced at the interface of the c-plane region with the first p-type semiconductor layer and the positively polarized charges to be induced at the interface of the facet-surface region with the first p-type semiconductor layer.

In the aspect of the light emitting apparatus, the light emitting layer may be an InGaN layer, and the InN molar fraction of In in the second p-type semiconductor layer may be lower than the InN molar fraction of In in the light emitting layer.

According to the light emitting apparatus, light can be confined in the light emitting layer as compared with a case where the InN molar fraction of In in the second p-type semiconductor layer is higher than the InN molar fraction of In in the light emitting layer.

In the aspect of the light emitting apparatus, the light emitting layer may have the c-plane.

According to the light emitting apparatus, non-light-emission recombination due to defects can be suppressed as compared with a case where the light emitting layer has no c-plane but has a facet surface.

In the aspect of the light emitting apparatus, the area of the c-plane of the first p-type semiconductor layer may be smaller than the area of the c-plane of the light emitting layer.

According to the light emitting apparatus, the current injected into the columnar section via a sidewall portion thereof where no light emitting layer is located, can be reduced as compared with a case where the area of the c-plane of the first p-type semiconductor layer is equal to the area of the c-plane of the light emitting layer.

In the aspect of the light emitting apparatus, the light emitting apparatus may include an electrode provided at the laminate and being in contact with the second p-type semiconductor layer.

According to the light emitting apparatus, the current between the electrode and the light emitting layer can be narrowed so that the current flows selectively to the central portion of the columnar section.

An aspect of a projector includes the aspect of the light emitting apparatus.

What is claimed is:

1. A light emitting apparatus comprising:
a laminate including a columnar section,
wherein the columnar section includes
an n-type semiconductor layer,
a first p-type semiconductor layer,
a light emitting layer provided between the n-type semiconductor layer and the first p-type semiconductor layer, and
a second p-type semiconductor layer in contact with the first p-type semiconductor layer,
the first p-type semiconductor layer is provided between the light emitting layer and the second p-type semiconductor layer,
the first p-type semiconductor layer has a c-plane and a facet surface,
the second p-type semiconductor layer has
a c-plane region provided at the c-plane, and
a facet-surface region provided at the facet surface,
the c-plane region has negatively polarized charges at an interface with the first p-type semiconductor layer, and
the facet-surface region has positively polarized charges at the interface,
wherein the light emitting layer is an InGaN layer, and
an InN molar fraction of In in the second p-type semiconductor layer is lower than an InN molar fraction of In in the light emitting layer.

2. The light emitting apparatus according to claim 1, wherein density of the negatively polarized charges at the interface of the c-plane region is higher than density of the positively polarized charges at the interface of the facet-surface region.

3. A light emitting apparatus comprising:
a laminate including a columnar section,
wherein the columnar section includes
an n-type semiconductor layer,
a first p-type semiconductor layer,
a light emitting layer provided between the n-type semiconductor layer and the first p-type semiconductor layer, and
a second p-type semiconductor layer in contact with the first p-type semiconductor layer,
the first p-type semiconductor layer is provided between the light emitting layer and the second p-type semiconductor layer,
the first p-type semiconductor layer has a c-plane and a facet surface,
the second p-type semiconductor layer has a c-plane region provided at the c-plane and a facet-surface region provided at the facet surface,
the c-plane region has negatively polarized charges at an interface with the first p-type semiconductor layer,
the facet-surface region has negatively polarized charges at the interface, and
density of the negatively polarized charges at the interface of the facet-surface region is lower than density of the negatively polarized charges at the interface of the c-plane region.

4. The light emitting apparatus according to claim 1, wherein the first p-type semiconductor layer is a GaN layer, and
the second p-type semiconductor layer is an InGaN layer.

5. The light emitting apparatus according to claim 1, wherein the light emitting layer has the c-plane.

6. The light emitting apparatus according to claim 5, wherein an area of the c-plane of the first p-type semiconductor layer is smaller than an area of the c-plane of the light emitting layer.

7. The light emitting apparatus according to claim 1, further comprising an electrode provided at the laminate and being in contact with the second p-type semiconductor layer.

8. A projector comprising the light emitting apparatus according to claim 1.

* * * * *